(12) United States Patent
Mizusawa

(10) Patent No.: US 6,778,029 B2
(45) Date of Patent: Aug. 17, 2004

(54) SURFACE-MOUNT CRYSTAL UNIT

(75) Inventor: Syuichi Mizusawa, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/420,058

(22) Filed: Apr. 21, 2003

(65) Prior Publication Data
US 2003/0197569 A1 Oct. 23, 2003

(30) Foreign Application Priority Data
Apr. 22, 2002 (JP) ........................................ 2002-119155

(51) Int. Cl.[7] .......................... H03B 1/00; H01L 41/053
(52) U.S. Cl. ....................... 331/68; 331/108 D; 310/348
(58) Field of Search .............................. 331/68, 108 D, 331/116 R, 116 FE, 158; 310/318, 348

(56) References Cited

U.S. PATENT DOCUMENTS 5,801,474 A * 9/1998 Sakairi .................... 310/313 R
6,229,404 B1 * 5/2001 Hatanaka ...................... 331/68
6,304,151 B1 * 10/2001 Uehara et al. .......... 331/108 D
6,507,139 B1 * 1/2003 Ishino et al. ................. 310/348
6,538,361 B2 * 3/2003 Yoshida ....................... 310/320

FOREIGN PATENT DOCUMENTS

JP            10-28024    *  1/1998

* cited by examiner

Primary Examiner—David Mis
(74) Attorney, Agent, or Firm—Knobbe Martens Olson & Bear LLP

(57) ABSTRACT

A surface-mount quartz crystal unit has a planar substrate having a pair of crystal-connecting terminals on a first surface and mounting terminals on a second surface, a quartz crystal blank having a pair of extending electrodes which is formed on the outer peripheral portion of the crystal blank and is secured to the crystal-connecting terminals, respectively, with a conductive adhesive to hold the crystal blank on the planar substrate, a metal film formed along the outer periphery of the first surface, and a concave metal cover having an open end face. The crystal blank is hermetically encapsulated between the metal cover and planar substrate by bonding the open end face to the metal film. Preferably, the open end face is bonded to the metal film with a brazing material.

12 Claims, 5 Drawing Sheets

SURFACE-MOUNT CRYSTAL UNIT

BACKGROUND OF THE INVENTION

1. Field of the Invention

The present invention relates to a surface-mount quartz crystal unit, and more particularly, to a surface-mount crystal unit which is suitable for reducing an area necessary to mount the crystal unit on a wiring board.

2. Description of the Related Art

A surface-mount crystal unit which has a quartz crystal blank encapsulated in a surface-mount container is frequently used as a frequency or time reference source, for example, in portable telephones because of its compact size and light weight. At present, typical surface-mount crystal units commercially available on the market have outer planar dimensions of 4.0 mm×2.5 mm and 3.2 mm×2.5 mm, and a surface-mount crystal unit now under investigation is further reduced in outer planer dimensions to 2.5 mm×2.0 mm.

FIG. 1 illustrates a conventional surface-mount crystal unit. The illustrated crystal unit comprises concave container body 1 made of laminated ceramics having bottom wall 1a and frame wall 1b; crystal blank 2 contained in container body 1, and cover 3 which is overlaid on container body 1. Bottom wall 1a is substantially rectangular in shape, when viewed in a plan view, and frame wall 1b is also formed in a substantially rectangular shape frame, so that container body 1 is formed with a substantially rectangular recess. A pair of crystal-connecting terminals, not shown, are formed on an inner surface of the recess (i.e., inner bottom face) of container body 1. A pair of mounting electrodes 4 are formed from side faces to a bottom face on the outer surface of container body 1. Mounting electrodes 4 are electrically connected to the crystal-connecting terminals through conductive paths or the like formed in the laminated ceramics.

Crystal blank 2 is, for example, an AT-cut quartz crystal blank. The AT-cut crystal blank has a resonant frequency determined by its thickness. As illustrated in FIG. 2, crystal blank 2, which is substantially rectangular in shape, is formed with excitation electrodes 5 on both main surfaces thereof such that they oppose each other. Extending electrodes 6 are extended from excitation electrodes 5 toward both ends of one side of crystal blank 2, respectively. Then, both ends of the one side of crystal blank 2, to which extending electrodes 2 are extended, are secured to crystal-connecting terminals on the inner surface of container body 1 by conducive adhesive 7. In this way, crystal blank 2 is held horizontally with respect to container body 1, and electrically and mechanically connected to container body 1.

Cover 3 is made, for example, of a flat metal plate, and bonded on the top face of frame wall 1b of container body 1, for example, by seam welding. In this event, frame wall 1b is previously provided with a metal ring or a metal film (not shown) for welding on the top face. Cover 3 is bonded on the top face of frame wall 1b to hermetically encapsulate crystal blank 2 in the recess.

However, in the conventional surface-mount crystal unit described above, as the outer planer size is increasingly reduced, container body 1 has a smaller effective area of the inner surface. This leads to a reduction in size of crystal blank 2 contained in container body 1. Even if crystal blank 2 used herein is an AT-cut crystal blank, the resonant frequency of which is determined by its thickness, crystal blank 2 exhibits higher oscillation characteristics and electric characteristics as it has a wider planar area, resulting in increased degrees of freedom in designing. Stated another way, the crystal blank is degraded more in the oscillation characteristics as its planar area is smaller, possibly causing an increase in crystal impedance (CI) and occurrence of spurious oscillations. Thus, the crystal blank having a smaller planar area exhibits lower electric characteristics and damages the degree of freedom in designing.

To overcome the foregoing problem, it is contemplated to reduce thickness d of frame wall 1b of concave container body 1 in order to increase the planar area of crystal blank 2 while maintaining the outer dimensions of the crystal unit. However, since this strategy involves a degraded strength of container body 1 and difficulties in manufacturing, thickness d of frame wall 1b cannot be reduced beyond a certain limit. Thus, concave container body 1 made of laminated ceramics has limitations in maintaining an effective internal area for containing the crystal blank therein while promoting a reduction in the outer dimensions thereof. For reference, assuming a crystal unit having the outer dimensions of 2.5 mm×2.0 mm, frame wall 1b must have a thickness of approximately 0.35 mm, so that container body 1 has an effective internal area of 1.8 mm×1.3 mm (2.34 mm$^2$). Since crystal blank 2 must be smaller than at least this area, the resulting crystal unit will experience difficulties in meeting specifications associated with CI, spurious oscillation and the like.

SUMMARY OF THE INVENTION

It is therefore an object of the present invention to provide a surface-mount crystal unit which is capable of maintaining an effective internal area wide enough to contain a crystal blank to exhibit satisfactory electric characteristics even if its outer planar dimensions are reduced.

The object of the present invention is achieved by a surface-mount crystal unit which has a planar substrate having a pair of crystal-connecting terminals on a first surface and mounting terminals on a second surface, a crystal blank having a pair of extending electrodes which is formed on the outer peripheral portion thereof and is secured to the crystal-connecting terminals with a conductive adhesive to hold the crystal blank on the planar substrate, a metal film formed along the outer periphery of the first surface, and a concave metal cover having an open end face, wherein the open end face is bonded to the metal film to hermetically encapsulate the crystal blank between the metal cover and the planar substrate.

Specifically, focusing attention on the requirement of a thick frame wall resulting from a crystal blank contained in a concave container body made, for example, of laminated ceramics, the present invention solves the problem in the conventional surface-mount crystal unit described above by substituting a planar substrate for the concave container body, and bonding to the planar substrate a concave metal cover which maintains a sufficient strength even with a small thickness. According to the present invention, since the thickness of the metal cover can be made smaller than the thickness of the frame wall made of laminated ceramics, an effective internal area can be increased for containing a crystal blank. As a result, a crystal blank having a large planar area can be used so that a resulting surface-mount crystal unit, even if reduced in outer dimensions, can maintain satisfactory electric characteristics. It should be noted that although there are known surface-mount crystal units which employ a planar substrate made of ceramic and a concave cover made of ceramic, a surface-mount crystal unit having a planar substrate and a concave cover made of a metal is not at all found on the market.

DETAILED DESCRIPTION OF THE INVENTION

Figure 2:
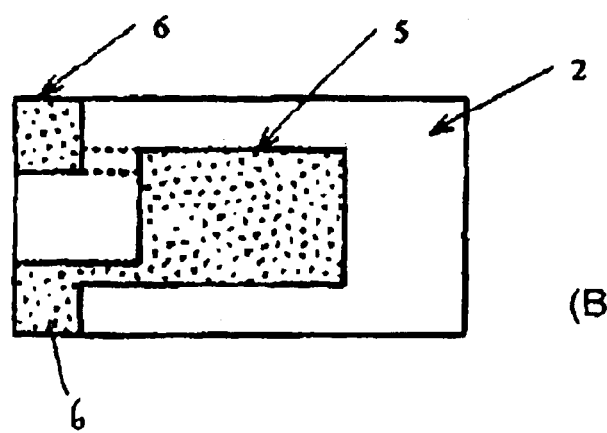
FIG. 2 is a plan view illustrating a conventional crystal blank.
Figure 3A:
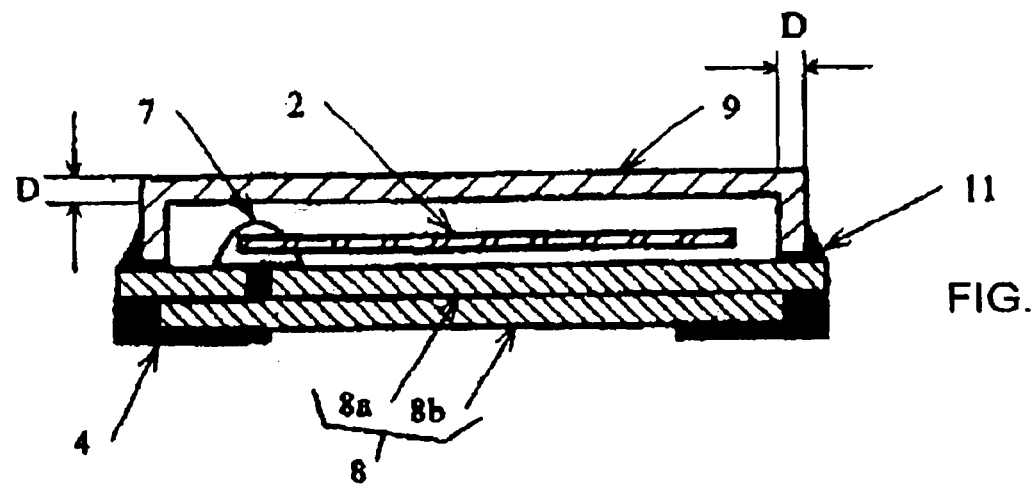
FIG. 3A is a cross-sectional view illustrating a surface-mount crystal unit according to a first embodiment of the present invention.
Figure 3B:
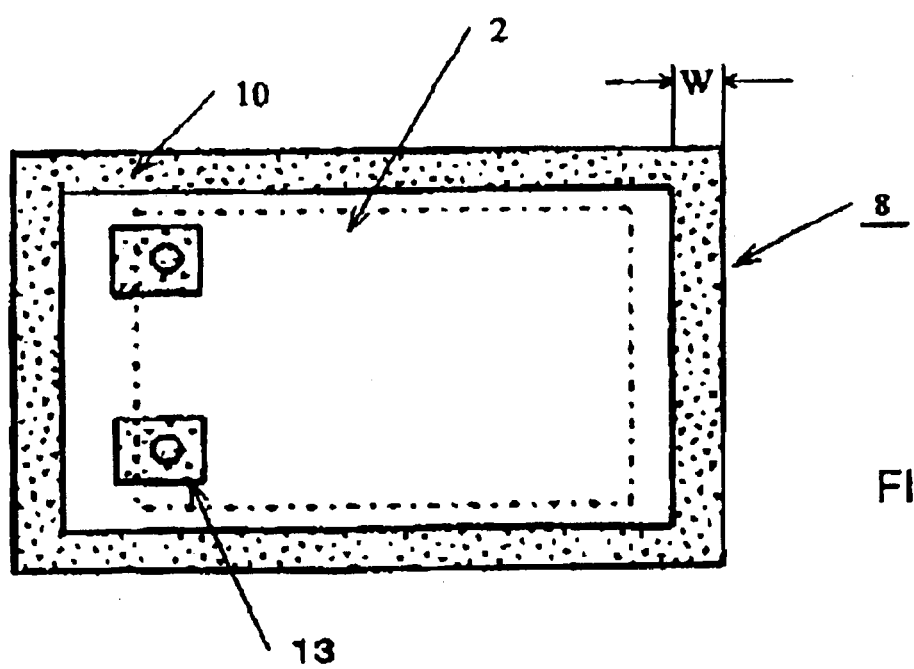
FIG. 3B is a plan view of a planar substrate used in the crystal unit illustrated in FIG. 3A.

A surface-mount quartz crystal unit according to a first embodiment of the present invention illustrated in FIGS. 3A and 3B comprises planar substrate 8 made of laminated ceramics; concave metal cover 9 provided to overlay planar substrate 8; and quartz crystal blank 2 encapsulated between planar substrate 8 and metal cover 9. Crystal blank 2 used herein is similar to that illustrated in FIG. 2, for example, an AT-cut quartz crystal blank in a substantially rectangular shape.

Planar substrate 8 is formed of laminated ceramics which include first layer 8a and second layer 8b. Flat substrate 8 is formed with a pair of crystal-connecting terminals 13 on one surface, i.e., on the surface of first layer 8a. Crystal-connecting terminals 13 are connected to both ends of one side of crystal blank 2 to which extending electrodes 6 are extended. Also formed on the surface of first layer 8a is metal film 10 which circumvents along the outer periphery of first layer 8a. Metal film 10 has width W of 0.15 mm, by way of example. Crystal-connecting terminals 13 and metal film 10 are integrally formed during firing of planar substrate 8 made of laminated ceramics. Frame-shaped brazing material 11, for example, gold-tin (AuSn) eutectic alloy is bonded to metal film 10. A pair of mounting electrodes 4 are formed on the bottom face and side faces of second layer 8b of planar substrate 8. Mounting electrodes 4 are electrically connected to crystal-connecting terminals 13 via through-holes formed through first layer 8a and second layer 8b. Crystal blank 2 is held horizontally with respect to planar substrate 8 and electrically and mechanically connected to planar substrate 8 by securing both ends of the one side of crystal blank 2, to which extending electrodes 6 are extended, to crystal-connecting terminals 13 with conductive adhesive 7.

Metal cover 9 is made, for example, of Kovar, nickel silver or the like, and formed into a concave shape by drawing or the like. Specifically, metal cover 9 has a substantially rectangular bottom wall, and side walls extending upright from the bottom wall. The side walls form an open end face. Metal cover 9 has outer planar dimensions smaller than those of planar substrate 8. The open end face of metal cover 9 has inside dimensions equal to those of metal film 10. Also, metal cover 9 has a thickness, particularly, thickness D of the side walls, smaller than width W of metal film 10.

For manufacturing the surface-mount crystal unit, after crystal blank 2 is first secured to planar substrate 8 with conductive adhesive 7, the open end face of metal cover 9 is positioned inside the outer peripheral edge of planar substrate 8, and plunged into brazing material 11 which is then heated. In this way, brazing material 11 is melt to form a fillet around the outer periphery of planar substrate 8 for bonding the open end face of metal cover 9 to planar substrate 8 to hermetically encapsulate crystal blank 2.

Figure 1:
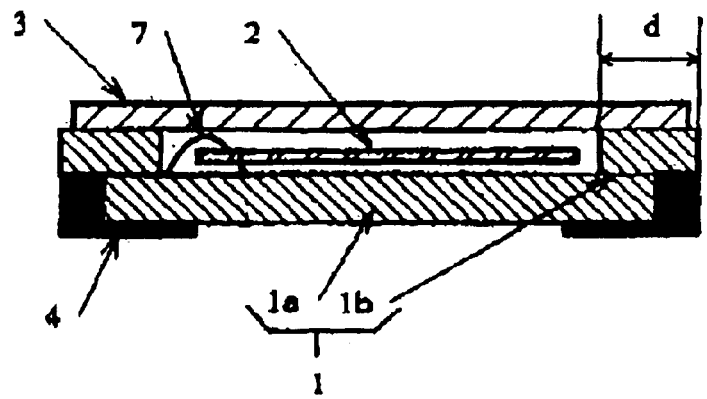
FIG. 1 is a cross-sectional view illustrating a conventional surface-mount crystal unit.

With the foregoing configuration, the use of metal cover 9 can lead to a reduction in thickness D of the side walls, as compared with frame wall 1b of conventional container body 1 made of laminated ceramics, as illustrated in FIG. 1. It is therefore possible to ensure a large effective internal area of planar substrate 8 for containing crystal blank 2 therein even if the crystal unit is reduced in the outer dimensions. Consequently, the resulting surface-mount crystal unit can exhibit satisfactory electric characteristics associated with CI, spurious and the like, because of its ability to contain a crystal blank having larger outer dimensions. For reference, in the surface-mount crystal unit in the first embodiment, metal cover 9 has a thickness of 0.08 mm with respect to frame wall 1b of 0.35 mm thick in the conventional crystal unit, and the metal film has width w of 0.15 mm, as mentioned above. Therefore, assuming that the crystal unit has outer dimensions of 2.2 mm×1.7 mm (3.74 mm$^2$), planar substrate 8 has an effective inside area of 3.74 mm$^2$ (2.2 mm×1.7 mm) for containing the crystal blank, which is about 1.6 times wider as compared with the conventional one. Since a crystal blank having a planar area about 1.6 times wider can be used for the crystal unit even in consideration of a clearance required for containing the crystal blank, it can be said that the crystal unit provides a very high practical value from a viewpoint of an improvement on the electric characteristics of the crystal unit.

Figure 4:
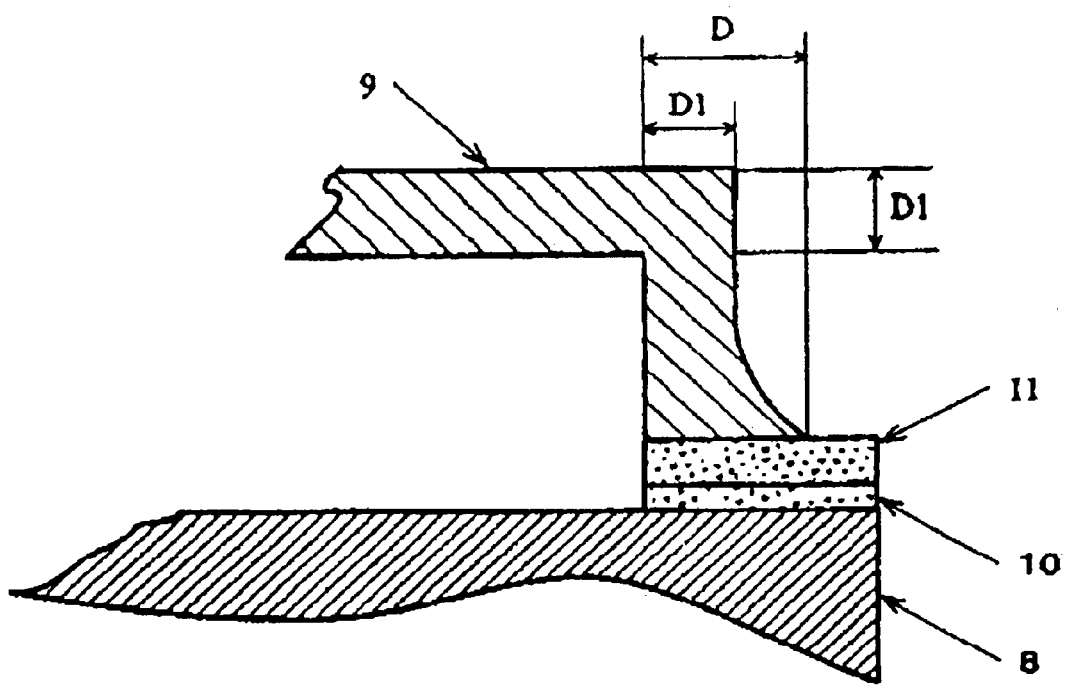
FIG. 4 is a partially enlarged cross-sectional view for describing a surface-mount crystal unit according to a second embodiment of the present invention.

Next, description will be made on a surface-mount crystal unit according to a second embodiment of the present invention. In the first embodiment described above, metal cover 9 has substantially the same thickness anywhere. Alternatively, as illustrated in FIG. 4, metal cover 9 may vary in thickness from one location to another. In the crystal unit in the second embodiment illustrated in FIG. 4, the side walls of metal cover 9 are crushed from the outside into a flared shape which diverges toward the open end face. In this event, the largest thickness is approximately equal to thickness D of the metal cover in the first embodiment, while thickness D1 of a main portion of metal cover 9 is smaller than thickness D of the metal cover in the first embodiment. In this way, the length of a bonding face between the open end face of metal cover 9 and metal film 10, i.e., a so-called seal path can be ensured in a similar amount to the first embodiment, thereby providing secure hermetic sealing. Also, since metal cover 9 can be reduced in thickness, the resulting surface-mount crystal unit can have a smaller height than that of the first embodiment. It is therefore possible to promote a reduction in the height of the crystal unit as well.

Figure 5A:
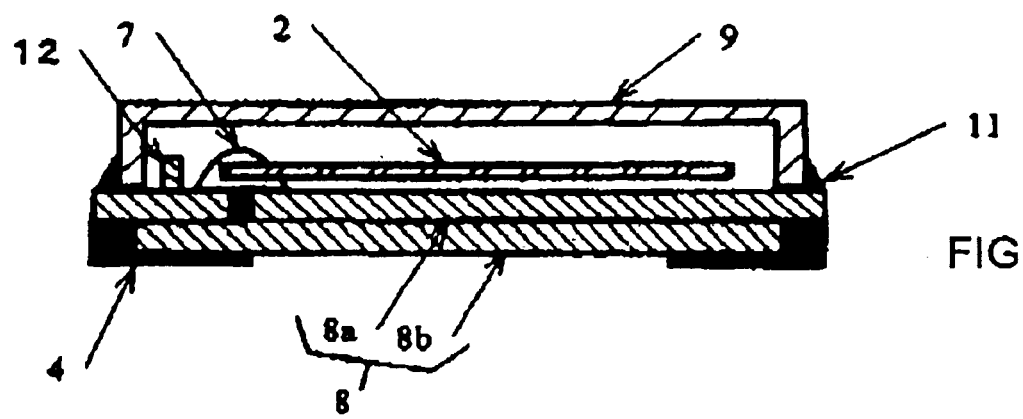
FIG. 5A is a cross-sectional view illustrating a surface-mount crystal unit according to a third embodiment of the present invention.
Figure 5B:
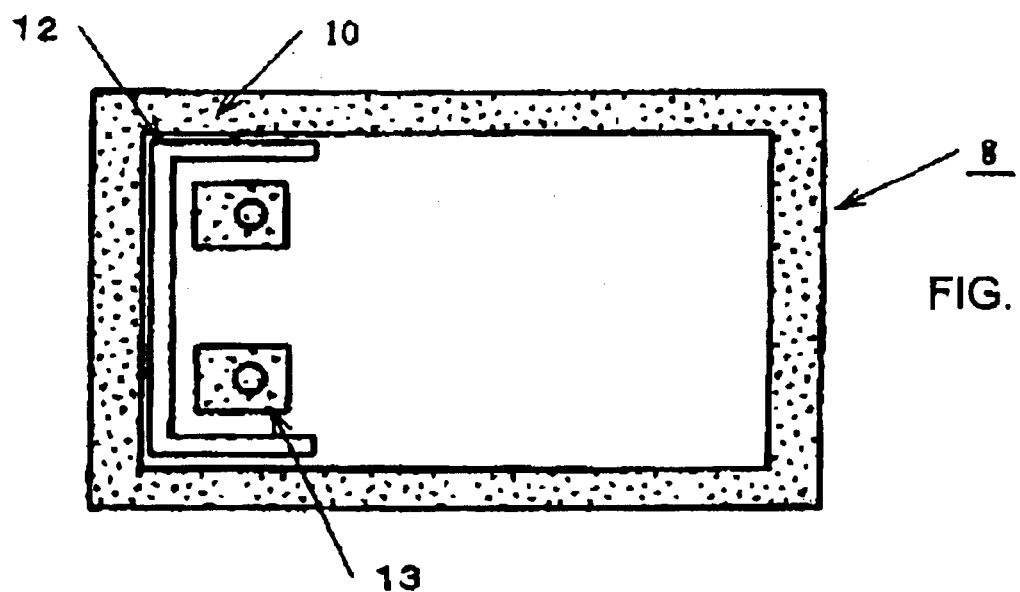
FIG. 5B is a plan view of a planar substrate used in the crystal unit illustrated in FIG. 5A.

In a surface-mount crystal unit according to a third embodiment illustrated in FIGS. 5A and 5B, jetty 12 is provided along an area in which metal film 10 is formed near crystal-connecting terminals 13 on the surface of planar substrate 8 in order to prevent electric short-circuiting of conductive adhesive 7 for securing crystal blank 2 to crystal-connecting terminals 13 to brazing material 11. In this event, since jetty 12 can be made to have a smallest possible width, jetty 12 will hardly affect the effective inside area for containing the crystal blank.

While the present invention has been described in connection with a surface-mount crystal unit given as an example, the present invention can also be applied to a surface-mount crystal oscillator which additionally comprises an IC (integrated circuit) chip that has a built-in oscillator circuit for connection with the crystal unit.

Figure 6A:
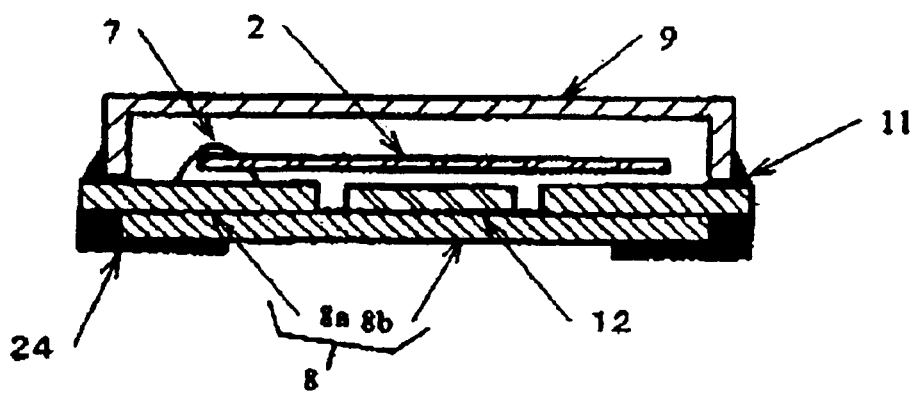
FIGS. 6A and 6B are cross-sectional views each illustrating a surface-mount crystal oscillator to which the present invention is applied.

In a surface-mount crystal oscillator illustrated in FIG. 6A, the surface-mount crystal unit in the first embodiment is formed with a recess by cutting a substantially central portion of first layer 8a of planar substrate 8. IC chip 12 which includes an oscillator circuit is contained in the recess to complete the crystal oscillator. In this crystal oscillator, crystal-connecting terminals 13 are connected to IC chip 12 through conductive paths, not shown. Also, mounting terminals 24 formed from the side faces to the bottom face of second layer 8b are connected to at least a power supply terminal, an output terminal and a ground terminal of IC chip 12 through a circuit pattern, not shown.

Figure 6B:
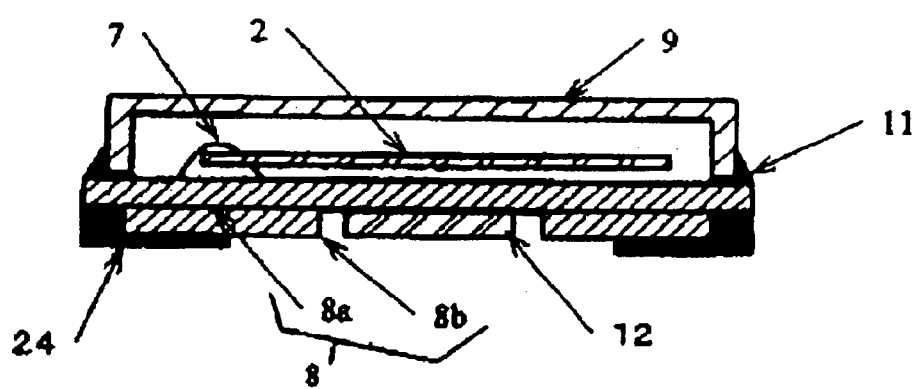

Similarly, in a surface mount-crystal oscillator illustrated in FIG. 6B, the surface-mount crystal unit in the first embodiment is formed with a recess by cutting a substantially central portion of second layer 8b of planar substrate 8. IC chip 12 which includes an oscillator circuit is contained in the recess to complete the crystal oscillator. Again, in this oscillator, crystal-connecting terminals 13 are connected to IC chip 12 through conductive paths, not shown, and mounting terminals 24 are connected to at least a power supply terminal, an output terminal and a ground terminal of IC chip 12 through a circuit pattern, not shown.

As will be appreciated from the foregoing, the present invention can be applied as well to a variety of crystal products such as a surface-mount crystal oscillator, a surface-mount crystal filter and the like, and such applications to these crystal products are also included in the technical scope of the present invention.

In the respective embodiments described above, brazing material 11 is disposed along the outer periphery of planar substrate 8. Alternatively, brazing material 11 may be disposed on the open end face of metal cover 9. While a gold-tin eutectic alloy having a melting point temperature of 280° C. is used for the brazing material, other brazing materials having different compositions may be used instead. Specifically, a brazing material having a melting point of 280° C. or lower may be used. When a brazing material having a lower melting point is used so that it is heated to a lower temperature for brazing, it is possible to reduce thermal impacts, for example, on conductive adhesive 7 and the like.

A method of sealing the planar substrate using the metal cover is not limited to brazing, but any other method may be employed as long as it can ensure air tight sealing. For example, a flange may be formed on the open end of the metal cover such that the planar substrate is sealed with the metal cover by electron beam welding of the flange to the planar substrate.

While the crystal blank is held on one side thereof by extending the extending electrodes to both ends of the one side, the extending electrodes may be extended to both sides of the crystal blank, so that the crystal blank is supported on both sides. Also, while the conductive adhesive is applied on both upper and lower faces of the crystal blank in the crystal unit illustrated in FIG. 3A, the conductive adhesive may be applied only to the lower face of the crystal blank.

While the foregoing embodiments employ a two-layer planar substrate, a single-layer planar substrate may be used as long as the airtightness can be ensured by via holes or the like.

What is claimed is:

1. A surface-mount crystal unit comprising:
a planar substrate having a pair of crystal-connecting terminals on a first surface and mounting terminals on a second surface;
a crystal blank having a pair of extending electrodes on an outer peripheral portion thereof, said extending electrodes being secured to said crystal-connecting terminals, respectively, with a conductive adhesive to hold said crystal blank on said planar substrate;
a metal film formed along an outer periphery of said first surface; and
a concave metal cover having an open end face,
wherein said open end face is bonded to said metal film to hermetically encapsulate said crystal blank between said metal cover and said planar substrate.

2. The crystal unit according to claim 1, wherein said open end face is bonded to said metal film with a brazing material.

3. The crystal unit according to claim 1, wherein said planar substrate comprises laminated ceramics.

4. The crystal unit according to claim 3, wherein said mounting terminals are electrically connected to said crystal-connecting terminals via through-holes formed through said laminated ceramics.

5. The crystal unit according to claim 2, wherein said metal cover has outer dimensions smaller than outer dimensions of said planar substrate, and said metal cover has a thickness at said open end face smaller than a width of said metal film.

6. The crystal unit according to claim 2, wherein said metal cover has a continuously increasing thickness toward an outer periphery on said open end face.

7. The crystal unit according to claim 1, wherein said planar substrate is substantially rectangular in shape.

8. The crystal unit according to claim 7, wherein said metal cover includes a substantially rectangular bottom wall, and side walls extending substantially upright from said bottom wall, said open end face being defined by said side walls.

9. The crystal unit according to claim 8, wherein said open end face is bonded to said metal film with a brazing material, said metal cover has outer dimensions smaller than outer dimensions of said planar substrate, and said metal cover has a thickness at said open end face smaller than a width of said metal film.

10. The crystal unit according to claim 1, further comprising a jetty disposed between said crystal-connecting terminals and said metal film on said first surface for preventing said conductive adhesive from flowing out.

11. A surface-mount crystal oscillator comprising:
a planar substrate having a pair of crystal-connecting terminals on a first surface and mounting terminals on a second surface;
a crystal blank having a pair of extending electrodes on an outer peripheral portion thereof, said extending electrodes being secured to said crystal-connecting terminals, respectively, with a conductive adhesive to hold said crystal blank on said planar substrate;

a metal film formed along an outer periphery of said first surface;

a concave metal cover having an open end face; and an IC chip mounted on said planar substrate and electrically connected to said crystal-connecting terminals and said mounting terminals, said IC chip including a built-in oscillator circuit for a crystal unit comprised of said crystal blank, wherein said open end face is bonded to said metal film to hermetically encapsulate said crystal blank between said metal cover and said planar substrate.

12. The crystal oscillator according to claim 11, wherein said planar substrate comprises laminated ceramics, and said IC chip is disposed in a recess formed on one of said first surface and said second surface.

* * * * *